United States Patent [19]
Mok

[11] Patent Number: 5,619,399
[45] Date of Patent: Apr. 8, 1997

[54] MULTIPLE CHIP MODULE MOUNTING ASSEMBLY AND COMPUTER USING SAME

[75] Inventor: Sammy L. Mok, Cupertino, Calif.

[73] Assignee: Micromodule Systems, Inc., Santa Clara, Calif.

[21] Appl. No.: 389,905

[22] Filed: Feb. 16, 1995

[51] Int. Cl.$^6$ ........................................... H05K 7/20
[52] U.S. Cl. ........................... 361/707; 257/718; 361/715; 361/718; 439/66; 439/487
[58] Field of Search .................. 174/16.3; 257/718–719, 257/726–727; 361/704, 707, 709–718, 770, 687; 439/66, 73, 83, 91, 485–487

[56] References Cited

U.S. PATENT DOCUMENTS

| | | |
|---|---|---|
| 4,642,889 | 2/1987 | Grabbe . |
| 4,774,632 | 9/1988 | Neugebauer . |
| 5,003,429 | 3/1991 | Baker et al. . |
| 5,010,038 | 4/1991 | Fox et al. . |
| 5,074,799 | 12/1991 | Rowlette, Sr. ............................. 439/91 |
| 5,229,917 | 7/1993 | Harris et al. . |
| 5,251,097 | 10/1993 | Simmons et al. . |
| 5,321,583 | 6/1994 | McMahon . |
| 5,424,913 | 6/1995 | Swindler ................................. 361/687 |
| 5,457,604 | 10/1995 | Ando . |
| 5,473,510 | 12/1995 | Dozier, II ................................. 361/719 |

Primary Examiner—Gregory D. Thompson
Attorney, Agent, or Firm—Wilson, Sonsini, Goodrich & Rosati

[57] ABSTRACT

A mounting assembly for a multiple chip module or other circuit module, which includes a board having a surface including an array of board contacts, such as a printed wiring board in a computer system. A circuit module, such as a multiple chip module, having a first surface and a second surface is included. The circuit module includes an array of circuit contacts on the first surface of the circuit module. An interposer between the board and the first surface of the circuit module, includes conductors between the circuit contacts in the array of circuit contacts on the circuit module and board contacts in the array of board contacts on the board. A thermal bridge member contacts the second surface of the circuit module. A heat spreader contacts the thermal bridge member to dissipate the heat over a large region. A fastener fastens the board, interposer, circuit module, thermal bridge member, and heat spreader together, such that thermal contact is made between the circuit module and the thermal bridge member and between the thermal bridge member and the heat spreader, and electrical contact is made between the array of circuit contacts and the conductors in the interposer, and between the conductors in the interposer and the array of board contacts. The fastener comprises a releasable mechanism which allows the circuit module to be easily inserted or removed. A circuit module may include the host processor and supporting circuitry for a computer.

31 Claims, 5 Drawing Sheets

MULTIPLE CHIP MODULE MOUNTING ASSEMBLY AND COMPUTER USING SAME

BACKGROUND OF THE INVENTION

1. Field of the Invention

The present invention relates to techniques for mounting integrated circuits on circuit boards; and more particularly to a more efficient mounting assembly for multiple chip modules which allows easy assembly of computers using multiple chip modules.

2. Description of Related Art

A multiple chip module (MCM) consists of multiple unpackaged integrated circuits assembled into a sub-system the size of traditional single chip packages. One type of multiple chip module includes a substrate, a thin film interconnect structure, and a plurality of integrated circuits mounted on the interconnect structure, and encapsulated in an epoxy passivation material.

MCMs represent an important new trend in interconnect packaging, offering users higher performance, lower costs, and smaller form factors than traditional printed circuit boards with plated through hole and surface mount technologies. By densely mounting multiple unpackaged integrated circuits on to one substrate, distances between components are reduced, thereby frequently improving performance and typically reducing the form factor of the sub-system.

By eliminating the need for single chip packages, MCM technologies eliminate an entire level of interconnect, and permit significantly greater reductions in product footprint than other interconnect technologies. While the reduction in form factor is itself of great value, MCMs also tend to increase performance and reduce cost. By densely packaging multiple chips onto a substrate, distances are reduced, which generally increases performance because signals do not have to travel so far between components, and results in cost savings through higher yields and reduced material requirements.

Multiple chip modules also create unique mounting problems. In particular, dense functionality means that there are large number of input/output paths which must be connected from the multiple chip module to the circuit board on which they are mounted. Also, the density of functionality concentrates the sources of heat in a small module. Thus, multiple chip modules must be mounted in a manner which dissipates the heat generated in the small package.

Thus, multiple chip modules present a package with hundreds of leads in a very small footprint, and provide a concentrated source of heat which must be dissipated. For many applications, the heat must be dissipated without active cooling systems such as fans. Thus, the multiple chip module may often be mounted on a heat spreading system such a large heat conductive plate which spreads the heat over a large area.

Another problem facing integrated circuit mounting technologies is the ability to replace or upgrade existing chips. Thus, when a computer is sold with one generation host central processing unit, such as an Intel class 386 processor, and the user desires to upgrade the computer to a class 486 processor, the user must replace at least the entire mother board on the computer. Some special packaging technologies have been developed to support processor upgrades, but they involve increases in form factor for the mother board, and require specialized mounting technology.

Accordingly, it is desirable to implement a multiple chip module which provides for efficient thermal dissipation without use of a fan or other active cooling technology, reduces the size of the system over single chip component implementations, is low cost, provides good electrical characteristics which handle 100 MHz or higher clock rates, and is easily installed and replaced into a completely assembled laptop or notebook case.

SUMMARY OF THE INVENTION

The present invention provides a mounting assembly for a multiple chip module or other circuit module, which allows for efficient thermal dissipation, dense functionality with very high lead count, good electrical characteristics to handle high speed clocks, and is easily installable.

According to one aspect, the invention can be characterized as an electronic assembly which comprises a board having a surface including an array of board contacts, such as a printed wiring board in a computer system. A circuit module, such as a multiple chip module, having a first surface and a second surface is included. The circuit module includes an array of circuit contacts on the first surface. A heat spreader contacts the second surface of the circuit module to dissipate the heat over a large region. A fastener fastens the board, circuit module, and heat spreader together, such that thermal contact is made between the circuit module and the heat spreader, and electrical contact is made between the array of circuit contacts and the array of board contacts.

A connector is be used between the board and the first surface of the circuit module, and includes conductors between the circuit contacts in the array of circuit contacts on the circuit module and board contacts in the array of board contacts on the board.

To facilitate easy installation and removal, the heat spreader assembly includes, in one aspect of the invention, a plate (a "thermal donut") having an opening larger than the circuit module, and a removable thermal bridge member larger than the opening in the plate. The thermal bridge member contacts the second surface of the circuit module and the plate to couple the circuit module to the heat spreader.

The circuit module in one aspect comprises a thermally conductive substrate, and at least one integrated circuit chip, with an interconnect structure mounted on the substrate. The thermal bridge member may be bonded to the thermally conductive substrate of the circuit module. Alternatively, a pressure contact may be established between the substrate of the circuit module and the thermal bridge member.

The fastener comprises a releasable mechanism which allows the circuit module to be easily inserted or removed, without sacrificing the superior heat dissipation characteristics and interconnection characteristics of the assembly. Thus, according to one aspect, the fastener comprises a clamp plate coupled to the board with at least one riser coupled to the clamp plate. The board and thermal bridge plate include passages to receive the riser. The heat spreader includes an opening with an inside dimension larger than the outside dimension of the circuit module, but smaller than the outside dimension of the thermal bridge member. The thermal bridge member is clamped to the riser with sufficient force to hold the thermal bridge member in thermal contact with the heat spreader, and the circuit module in electrical contact with the board through the interposer. The clamp can be implemented using a screw, a spring loaded clip, or other technique which supplies sufficient force for good thermal and electrical contact in the assembly.

According to another aspect, the invention can be characterized as a computer comprising a case having an openable cover. A circuit board is mounted within the case and has a mounting surface facing the openable cover of the case. The system includes a circuit module or modules which could, for instance, contain the host central processing unit and supporting circuitry, a graphics controller, a multi-media controller, or a system add-on. A heat spreader is mounted with the case. A fastener assembly, which when engaged fastens the mounting surface of the circuit board, the circuit module and the heat spreader together is provided, such that thermal contact is made between the circuit module and the heat spreader, and electrical contact is made between the circuit module and the circuit board. When the fastener assembly is disengaged, the circuit module may be removed through the openable cover of the case. The fastener assembly may take the structure as outlined above, such that the circuit module may be inserted and removed by the use of screws, or other simple clamping technologies.

According to yet another aspect of the present invention, the assembly may include a second circuit module, such as cache SRAM, stacked with the first circuit module. In this case, the fastening assembly establishes thermal contact between the second circuit module and the circuit board or other heat sink, and electrical contact between the second circuit module and the contacts on the circuit board and/or the first circuit module.

The invention can also be characterized as a method for assembling a computer having an openable cover, a circuit board within the cover and a heat spreader. The method includes:

providing an array of board contacts on the circuit board inside the computer accessible through the openable cover;

providing a circuit module including one or more integrated circuits and an interconnect structure, the interconnect structure including an array of circuit contacts; and mechanically fastening the circuit module to the circuit board through the openable cover of the computer such that thermal contact is made between the circuit module and the heat spreader, and electrical contact is made between the circuit module and the circuit board.

The step of mechanical fastening according to this aspect of the invention may include providing an interposer between the circuit board and the circuit module, a thermal bridge contacting the heat spreader and the surface of the circuit module; and fastening the circuit board, interposer, circuit module, thermal bridge member and heat spreader together using the mechanical fastening technologies outlined above.

Accordingly, the present invention provides a mounting technology for multiple chip modules particularly adapted to use in small laptop or notebook computers, or other small computer systems. The technology is also suitable for desktop systems or other large systems using integrated circuits. The invention is based on the use of a heat spreader to efficiently distribute the heat load to as much of the case as possible, lowering the difference in temperature through the case. Also, a clamping system is used to thermally couple the multiple chip module to the heat spreader as well as electrically connect the multiple chip module to the system printed wiring board. This allows compactness of the package as well as ease of assembly, which leads to lower costs.

An interposer is used in one preferred embodiment for electrical connection to the system printed wiring board. This improves compactness and simplicity in the fabrication process, leading to lower cost as well as superior electrical characteristics for high speed circuits. In addition, the interposer allows all power filtering components to be moved off the MCM. Since these components may require a soldering or epoxy cure step for the MCM, moving them off the MCM helps lower the overall system cost by eliminating fabrication steps for the MCM itself. A thermal bridge can be used to allow the multiple chip module to be installed through the laptop case or other openable part of the case without sacrificing efficient thermal performance of the heat spreader. Furthermore, the technique can be used for providing easy module replacement, for upgrading systems, without sacrificing thermal or electrical performance of the mounting technology.

Other aspects and advantages of the present invention can be seen upon review of the figures, the detailed description, and the claims which follow.

DETAILED DESCRIPTION

Figure 1:
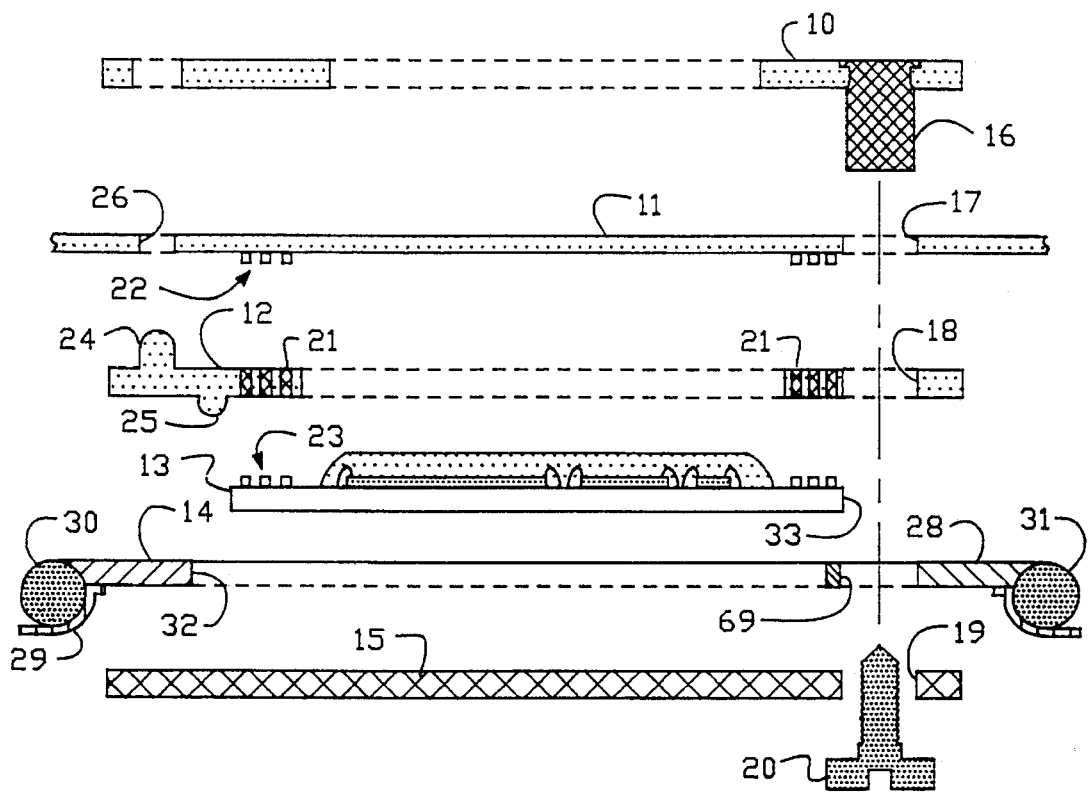
FIG. 1 shows an exploded view of the multichip module mounting assembly according to the present invention.
Figure 2:
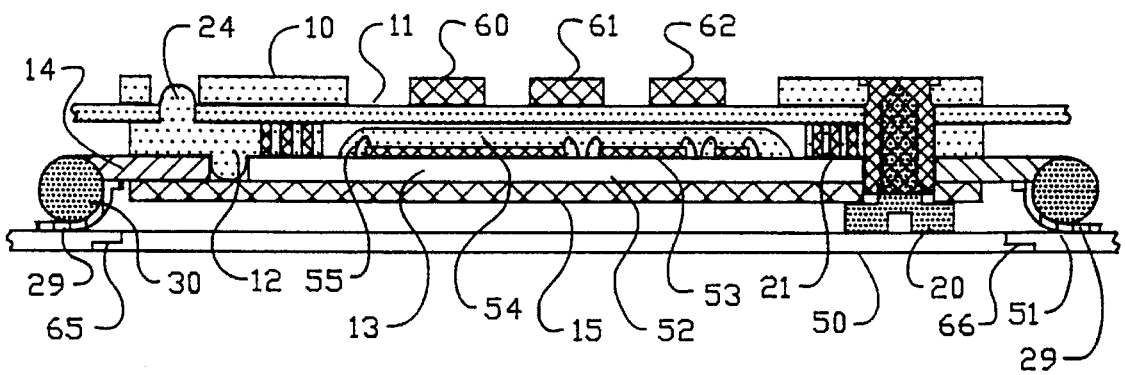
FIG. 2 shows the multichip module mounting assembly in a computer system.

A detailed description of a preferred embodiment is provided with reference to FIGS. 1 through 9, in which FIGS. 1 and 2 provide an expanded view and an assembled view of a preferred embodiment.

The assembly as shown in FIG. 1 includes a clamp plate 10 made of a material such as stainless steel. Next, a printed wiring board 11 or other circuit board technology is placed under the clamp plate 10 on which components of an electronic system are mounted. An interposer structure 12 is included below the circuit board 11. A multiple chip module 13 is below the interposer 12. A heat spreader assembly 14 and a thermal bridge plate 15 are below the circuit module 13.

The interposer 12 comprises a rigid or flexible plate with an array of conductors through the plate, arranged such that when pressure is applied to the array of conductors, electrical connection is made between contacts on either side of the plate. Thus, the interposer 12 may be of the type known as CIN::APSE (a trademark of Cinch, a division of Labinal Components and Systems, Inc., located in Elk Grove Village, Ill.) using so-called "fuzz button" conductors 21. The "fuzz button" conductors comprise a gold plated molybdenum wool which fills passages through the interposer material to provide the conductive pathways. Alternative interposer techniques may be used, such as Ampliflex and Ampliflat provided by Amp, Inc. of Harrisburg, Pa. Also, so-called z-flex interposer technology can be used, based on z-shaped wires imbedded in an elastomer, which establish electrical connection upon application of pressure.

The clamp plate 10 includes one or more self-clinching standoffs forming threaded risers 16. The printed wiring board 11, interposer 12, thermal donut 28 and thermal bridge member 15 include passages 17, 18, 69, 19 for receiving the riser 16. A screw 20 is used to clamp the assembly together.

The interposer 12 includes a template surrounding a plurality of conductors, such as conductor 21. The printed wiring board 11 includes an array of board contacts generally 22 (exaggerated height in the figure). Similarly, the multichip module 13 includes an array of circuit contacts generally 23 (exaggerated height in the figure). The conductors 21 provide for electrical connection between the circuit contacts in the array of circuit contacts 23, and board contacts in the array of board contacts 22 when the assembly is fastened together. Also in the interposer 12 are alignment bosses 24 and 25. The alignment boss 24 fits within a receiving passage 26 on the printed wiring board 11. The alignment boss 25 fits between the edge of the multichip module 13, and the edge of the heat spreader assembly 14.

The heat spreader assembly 14 comprises a thermal "donut" member 28, which is coupled to a copper, or other heat conductive material, spread plate 29 which fans out through the assembly in which the circuit board is mounted to spread the heat. The spread plate may be quite large, for instance 8 inches by 10 inches or more. Also, heat pipes 30, 31 may be included in the spreader assembly to assist in transferring the heat away from the thermal donut member 28. As can be seen, the thermal donut member 28 has an inside dimension 32 which is larger than the outside dimension 33 of the multichip module 13.

The thermal bridge member 15 may comprise a hard copper material, diamond, aluminum, or other efficient heat conductor, which can make efficient thermal contact with the thermal donut member 28 under pressure of the screw. Also, heat pipes could be on, or embedded in, the thermal bridge. A compliant, heat conductive gasket or thermal grease may be placed between the thermal bridge member 15 and the thermal donut 28 if necessary.

The screw 20 and riser 16 make an assembly for fastening the components of the stack together. The riser may not be necessary for a given implementation, being replaced for instance by a simple threaded recess in the clamp plate. The stack may alternatively be clamped using a spring loaded clip, or other mechanical fastener which develops sufficient force to effect the electrical contacts in the interposer 12 as well as the thermal contact between the thermal bridge 15, heat spreading donut 28 and the circuit module. In the case of the CIN::APSE interposer, this pressure is about 2 ounces or more per conductor in the interposer.

FIG. 2 shows the assembled package mounted on a case 50 of a computer system, such as a laptop computer. In this illustration, the heat spreader assembly 29 is coupled to the case 50 using a compliant and thermally conductive adhesive film 51 to facilitate heat transfer from the heat spreader to as much of the case as possible. The assembled components are given the same reference numbers in FIG. 2 as in the expanded view of FIG. 1.

Also, FIG. 2 shows some additional features. Thus, with reference to FIG. 2 it can be seen that the multichip module includes a substrate 52 which is made of a thermally conductive material such as aluminum, copper, or diamond. A plurality of integrated circuits 53 are mounted on the substrate. A die passivation material 54 covers the integrated circuits. The integrated circuits are wired by means of the wires 55 to an interconnect structure (not shown in Fig. 2) which includes the array of circuit contacts 23. Also, because of the short lead distances involved using the interposer technology, the printed wiring board may have mounted thereon power filter capacitors 60, 61, 62 for providing supply filtering to the processing resources in the multichip module.

Alternative multichip module technology may be used as well. For instance, integrated circuits can be mounted using flip chip techniques on a membrane which includes an interconnect structure, such as a multilayer polyimide/copper interconnect. The membrane is supported on a frame, with the chips mounted inside the frame. An array of contacts may be formed on the side of the membrane opposite the chips, and overlapping the frame, such that the rigid frame is used to transfer pressure to the interposer structure. Alternatively, the array of contacts may be inside the frame, in an unsupported part of the membrane. In this case electrical contact is made to the printed wiring board without an interposer by applying pressure to the membrane behind the array of contacts with a compliant pressure pad between the membrane and the thermal bridge plate.

Also shown in FIG. 2, the case 50 for the computer may include an openable cover as indicated by the cuts 65 and 66 in the drawing. Thus, by removing the openable cover, and releasing the screw 20, the multichip module 13 can be easily removed or replaced from the back side of the printed wiring board. Furthermore, the removal and replacement of the multichip module does not sacrifice the quality of electrical connection or the thermal characteristics of the assembly.

An alternative system inverts the structure of FIG. 2, with the screw being fastened from the top of the clamp plate on the print wiring board. In this case no thermal bridge is necessary. Rather the heat spreader assembly may be continuous across the back of the circuit module, in which the thermal donut is replaced by a solid plate, having threaded recesses or a threaded riser assembly attached thereto. This way the screws fasten the heat spreader, circuit module, interposer and printed wiring board together to establish the appropriate thermal and electrical contacts.

Figure 3:
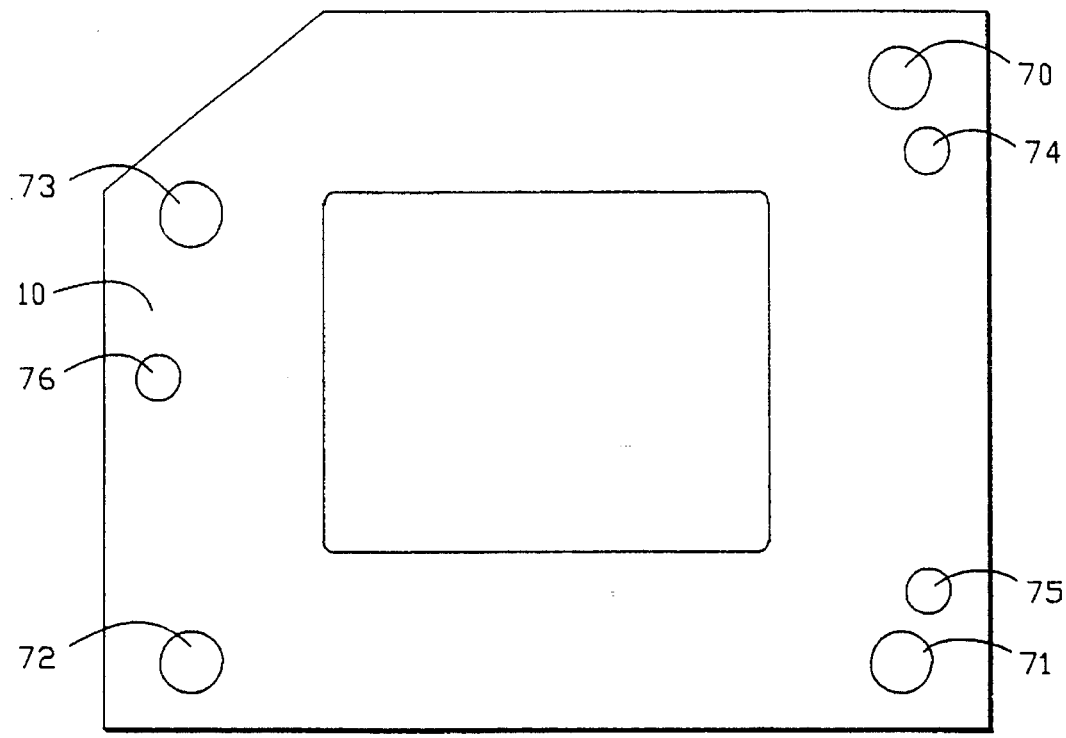
FIG. 3 illustrates the clamp plate in the assembly of FIG. 1.

FIGS. 3 through 6 provide a top view of the clamp plate, interposer, multichip module and thermal donut, and thermal bridge member, respectively. Thus, FIG. 3 illustrates a clamp plate 10 which can be used according to the present invention. The clamp plate 10 of FIG. 3 includes four riser assemblies 70, 71, 72, 73. Also, three passages 74, 75, 76 are included to receive the boss members, such as boss member 24 on the interposer as shown in FIG. 1.

Figure 4:
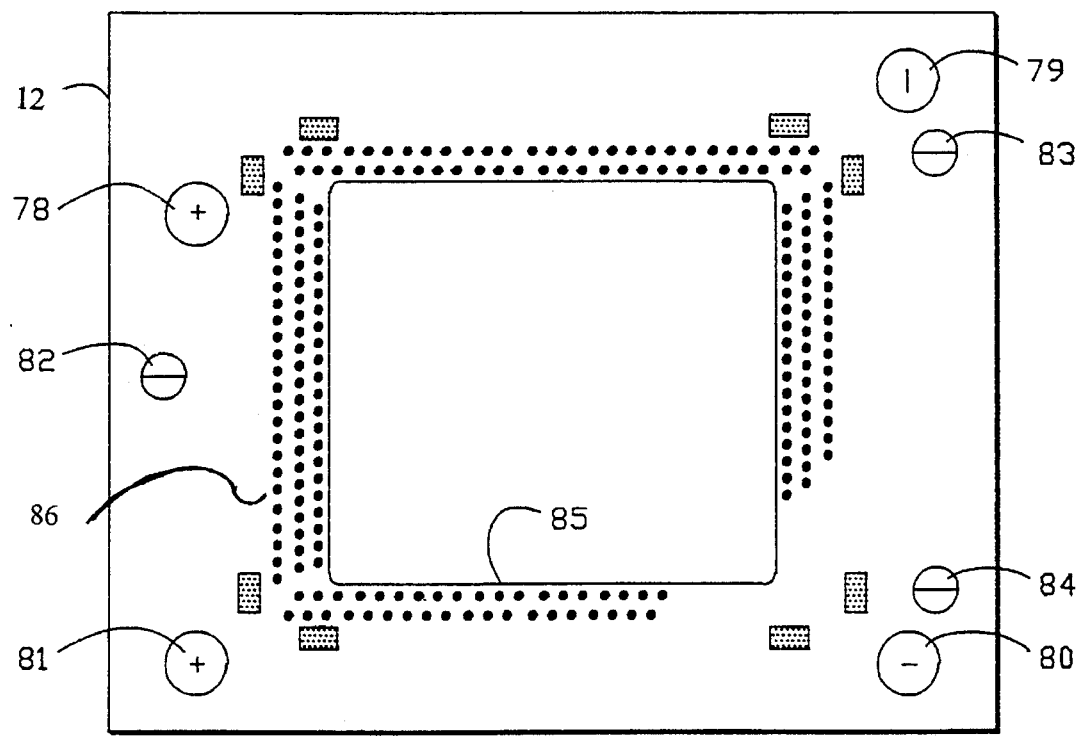
FIG. 4 illustrates the interposer in the assembly of FIG. 1.

FIG. 4 shows the interposer 12. The interposer 12 includes passages 78, 79, 80, 81 for receiving the risers 70 through 73 of the clamp plate 10. Also, the alignment bosses 82, 83, 84 are included which register with the passages 74 through 76 of the clamp plate, and with similar passages through the printed wiring board, such as passage 26 as shown in FIG. 1.

The interposer includes an inside opening 85 having an inside dimension. Also on the interposer is an array of conductors, such as conductor 86. In the embodiment illustrated, there are 213 conductors in the array based on the so-called "fuzz button" technology. Many more are possible.

Figure 5:
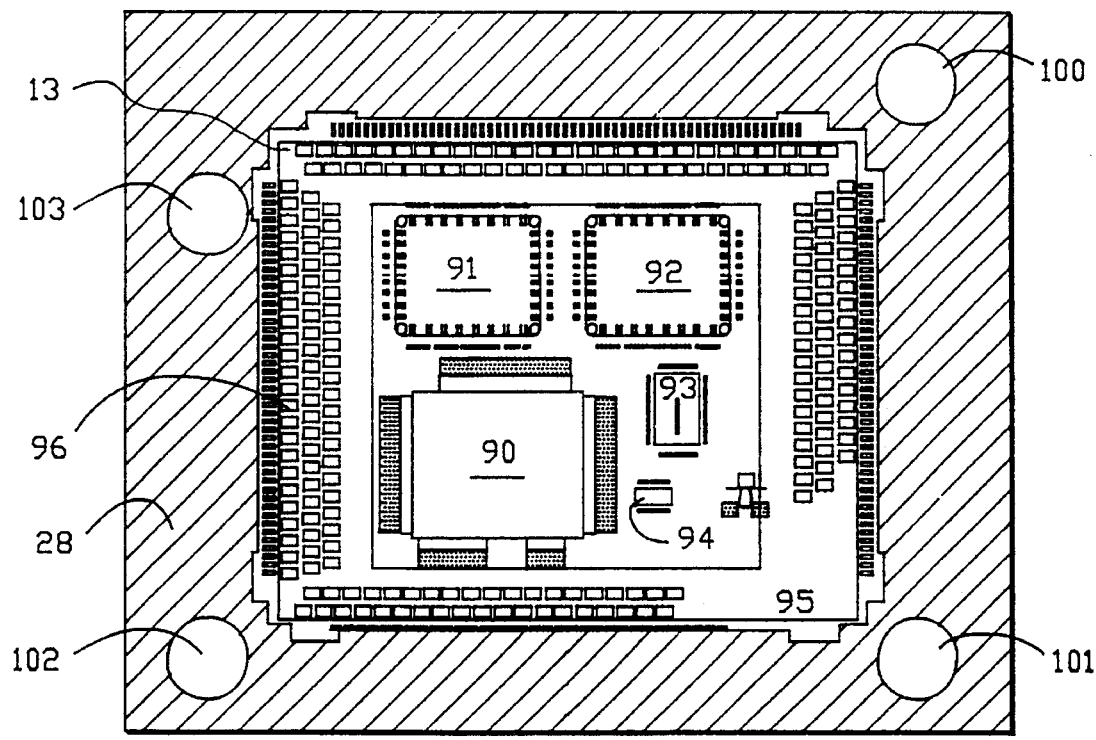
FIG. 5 illustrates the thermal donut of the heat spreader assembly and multichip module in the assembly of FIG. 1.

FIG. 5 shows the multichip module 13 and the thermal donut member 28. As can be seen, the multichip module 13 fits inside the thermal donut 28. It includes a plurality of integrated circuits, 90, 91, 92, 93, 94, and an interconnect structure 95 which includes an array of circuit contacts, such as contact 96. The array of circuit contacts corresponds with the array of conductors, such as conductor 86 in the interposer 12 and with a corresponding array of board contacts on the printed wiring board 11, such as contacts 22 shown in FIG. 1. The thermal donut 28 includes passages 100, 101, 102, 103 for receiving the screw 20 and the risers 70 through 73 as shown in FIG. 3.

According to one aspect of the invention, the integrated circuits 90 through 94 comprise processing resources for a laptop computer, such as a host central processing unit, and memory controller chips and the like supporting the host microprocessor. Using multiple chips, a variety of host architectures can be implemented on the multichip module, all having a standardized array of contacts, such as contact 96. Using a standardized array of contacts for a variety of host processors, allows a common printed circuit board to be utilized in the manufacture of computers, independent of the host processor chosen. Thus, for example, a single printed wiring board can be utilized for 386 class processors, 486 class processors, Pentium class processors, and a variety of RISC based processors which are being introduced.

Figure 6:
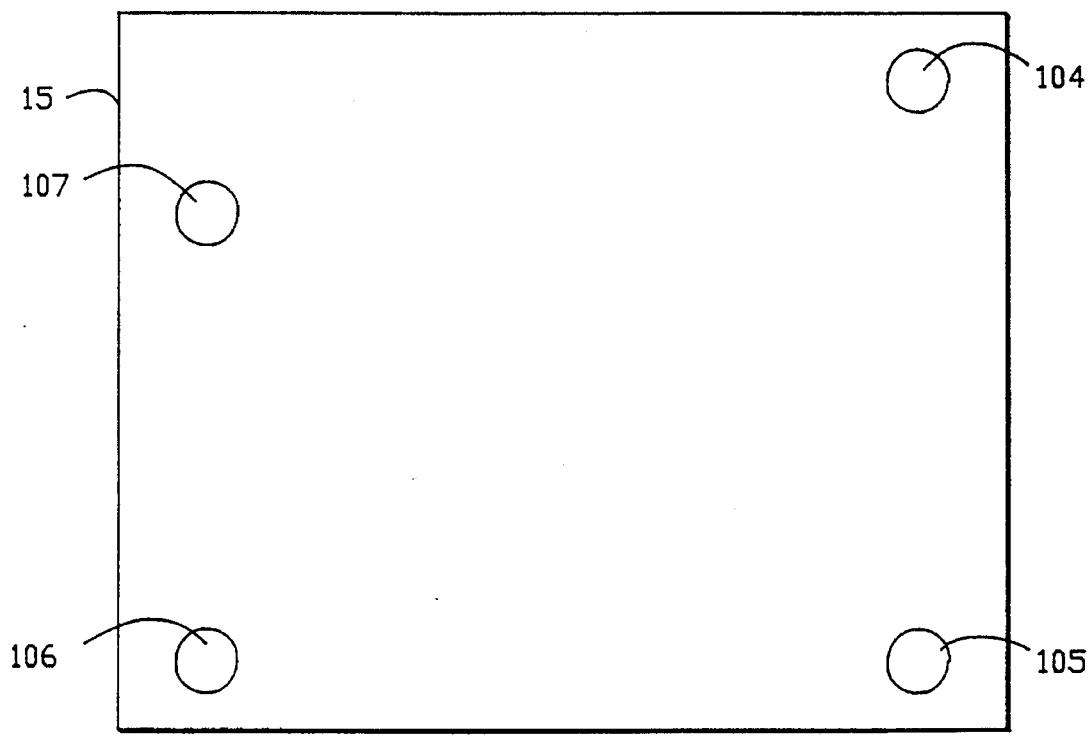
FIG. 6 illustrates the thermal bridge member in the assembly of FIG. 1.

FIG. 6 illustrates the configuration of the thermal bridge member 15 which may be bonded to the substrate 52 (FIG. 2) of the multichip module, such as illustrated in FIG. 2, or contacted with it mechanically using the clamping mechanism of the present invention. As can be seen, the thermal bridge member 15 includes passages 104, 105, 106, 107 for receiving the screw 20 and the risers 70 through 73 as shown in FIG. 3.

Figure 7:
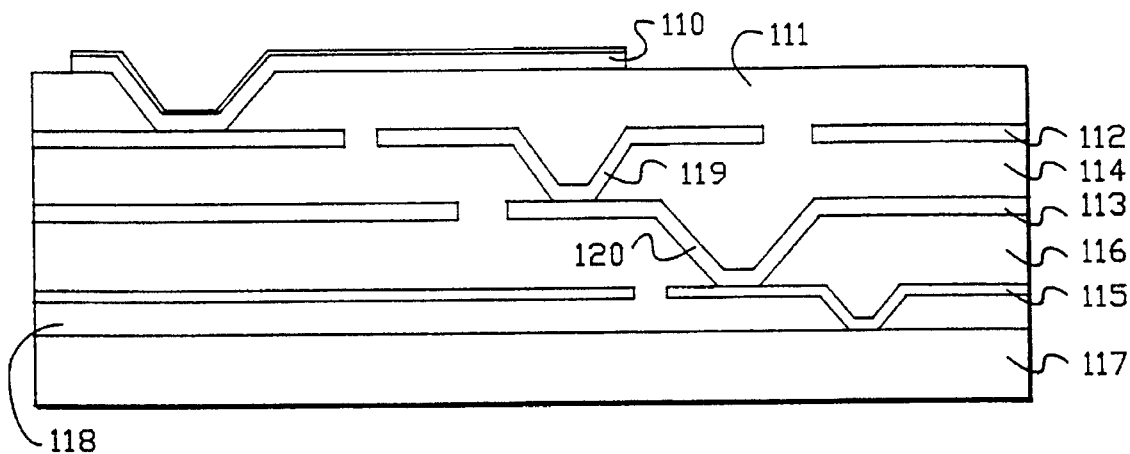
FIG. 7 illustrates a technology which may be used for the interconnect structure for the multichip module of FIG. 1.

FIG. 7 illustrates an interconnect structure for the MCM. Thus, the interconnect structure may be made using commercially available substrate processes provided by Micro-Module Systems, Inc. of Cupertino, California. One to seven layers, or more, of interconnect structure can be built using the standard process.

The interconnect structure as illustrated in FIG. 7 consists of a pad 110 having six microns of copper, two microns of nickel, and two microns of aluminum. The pad is isolated from underlying interconnect by twelve microns of polyamide in the region 111. A y-signal interconnect layer is included based on four microns of copper 112. An x-interconnect layer 113 consisting of about four microns of copper is included, separated from the y-interconnect layer 112 by about six microns of polyamide in the region 114. A power plane layer 115 consisting of about 2 microns of copper underlies the x-interconnect layer 113 and is separated therefrom by about twelve microns of polyamide in the region 116. A ground plane 117 consisting of fifty mils of aluminum in this illustration (or two microns of copper), is included, separated from the power plane conductor 115 by a supply bypass dielectric of about 3.5 microns of polyamide in the region 118. The various layers are interconnected as illustrated in the figure by the via structures generally 119 and 120. The interconnect layers are defined using standard photolithography equipment, traces are sputtered and then electroplated up to the necessary thickness.

Figure 8:
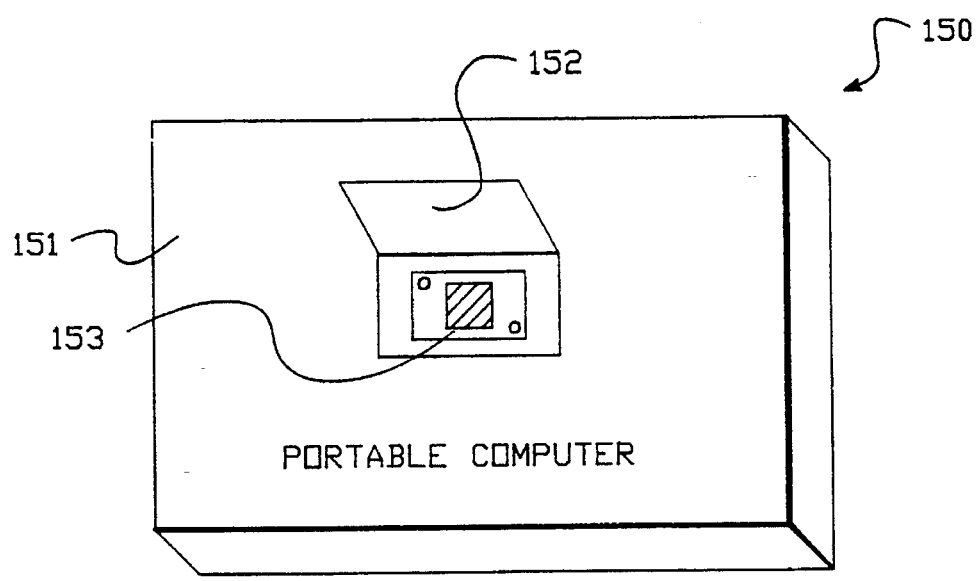
FIG. 8 provides a perspective of a portable computer in which the mounting assembly of the present invention is used.

FIG. 8 provides a simplified perspective of an application of the present invention with a portable computer 150. Thus the portable computer includes a case 151, with an openable cover 152. Within the cover 152, the multichip module mounting assembly 153 according to the present invention is accessed. Thus, unskilled labor or owners of the portable computer 150, can replace the multichip module 153 with a simple screwdriver. The openable cover may take a variety of forms, from a substantial portion of the case for the computer, which when removed exposes the opening in the heat spreader, to a small cover which is coupled to a slot in the case in which the mounting assembly is found.

Figure 9:
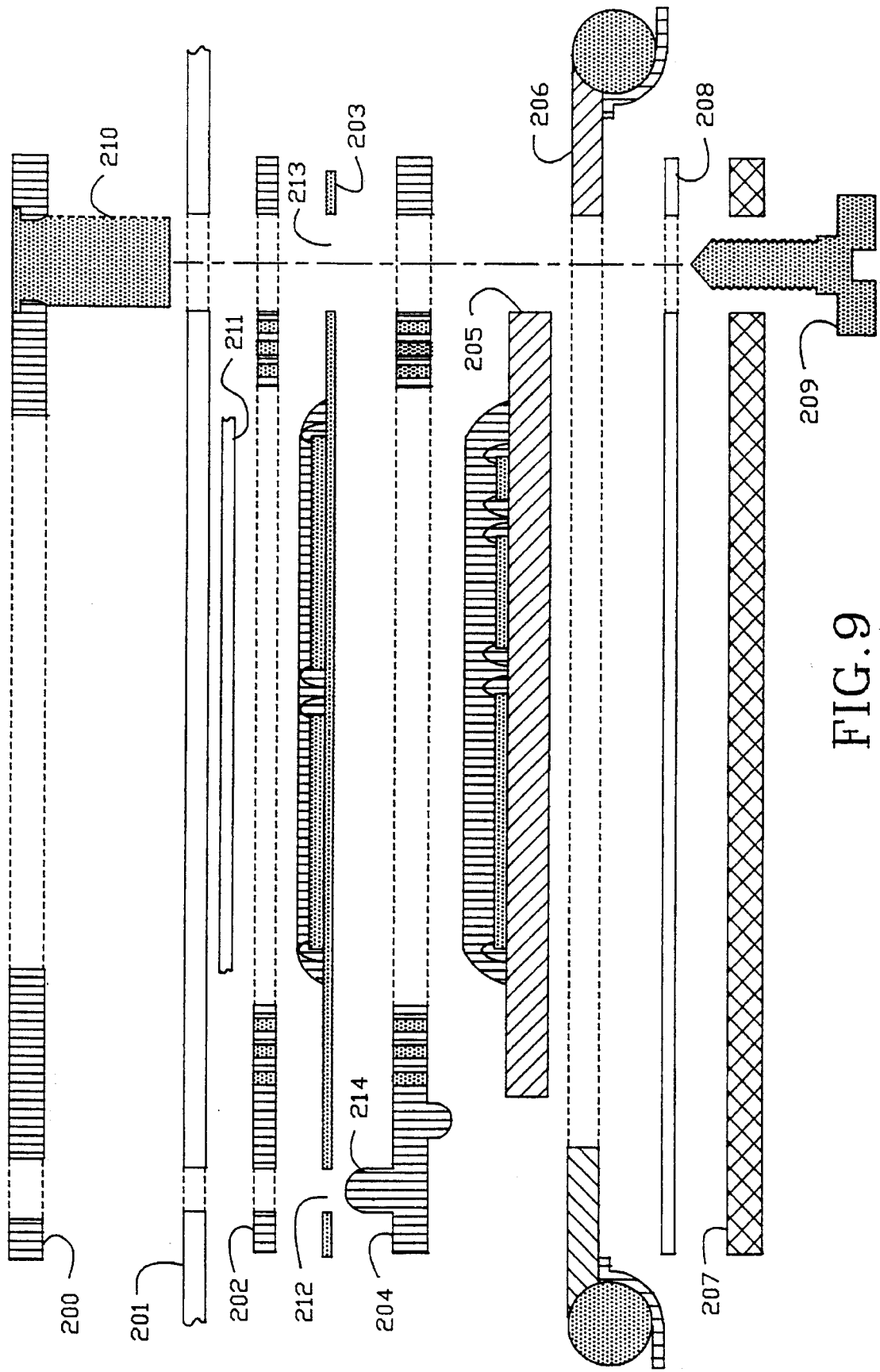
FIG. 9 illustrates the mounting assembly according to the present invention with stacked multichip modules.

FIG. 9 illustrates yet another embodiment based on stacked multichip modules. The components in FIG. 9 are illustrated in an exploded view. Obviously when assembled, the structure is quite compact as can be visualized with reference to FIG. 2.

Thus, a mounting assembly according to the present invention with stacked multichip modules includes in the embodiment shown in FIG. 9, a stainless steel top clamp plate 200 which is placed over the printed wiring board 201. A first interposer 202 is placed between the printed wiring board 201, and a top multichip module 203. A second interposer 204 is placed between the top multichip module 203 and a bottom multichip module 205. The heat spreader assembly 206 is mounted within the case of the computer. A thermal bridge member 207 is placed in thermal contact with the substrate of the bottom multichip module 205. Also, a thermally conductive, compliant gasket 208 may be placed between the substrate of the bottom multichip module 205 and the thermal bridge member 207, and in the region between the thermal bridge member 207 and the heat spreading assembly 206. The gasket 208 will account for any mismatches in the surfaces of the materials. The gasket 208 may be manufactured using conformable thermally conductive elastomers, such as are commercially available, for example, from Thermagon of Cleveland, Ohio.

A screw 209 is used with riser 210 coupled to the clamp plate 200 to form a clamp mechanism. As mentioned above, other clamping technologies could be used depending on the needs of a particular implementation.

The stacked system of FIG. 9 is designed such that the bottom multichip module 205 should be the primary source of heat, and directly coupled to the heat spreader assembly 206 through the thermal bridge member 207. The top multichip module 203 might be a lower energy system, such as a cache upgrade for a processor which might dissipate a watt or two. The heat from the top multichip module 203 can thus be efficiently spread in the printed wiring board 201 itself. To facilitate the transfer of heat from the top multichip module 203 to the printed wiring board, a conformable thermally conductive elastomer gasket 211 may be placed between the multichip module 203 and the printed wiring board 201.

As shown in FIG. 9, the top multichip module 203 comprises a multilayer wiring board 250, such as a polyimide/copper sturcture as discussed above, with integrated circuits 251, 252 on the top, and on the integrated circuit 253 (or circuits) on the bottom. The top and bottom integrated circuits may be encapsulated in a protective epoxy as shown. Alternative embodiments may have chips on only one side.

Furthermore, the top multichip module 203 may include contacts on both sides of the substrate to provide contacts to the interposers 204 and 202 such that the second multichip module 203 is in electrical communication with both the bottom multichip module 205 and contacts on the printed wiring board 201.

The top multichip module 203 can have passages, such as passages 212 and 213 for receiving the alignment boss 214 on the first interposer 204 and the riser 210 on the clamp plate 200. Alternatively, it can be designed with a smaller outer dimension such that the riser and boss 214 do not come into play. However, some alignment technology must be utilized for ensuring that the contacts are properly made.

The multichip module mounting process according to the present invention can be particularly applied to the manufacturing of computers, such as laptop or portable computers. These devices may be fully assembled with displays and keyboards and the like, with the processing module implemented on a multichip module such as those described herein. The final assembly step for the computer involves opening the cover on the laptop, and inserting a multichip module by the techniques described above. Thus, the circuit board is provided with an array of contacts and an interposer mounted thereon. When the multichip module is to be inserted, it is simply dropped into the opening of the heat spreader assembly, the thermal bridge plate is placed over the module and tightened down to make good thermal and electrical contact. In addition to manufacturing the device in this manner, multichip modules can be replaced to provide for upgrades of computer systems by users of such systems in the field.

Accordingly, the present invention provides multichip module mounting technology for use with laptop or notebook computers (and any other systems using integrated circuits) which achieves several advantages. Efficient thermal dissipation is accomplished without requirement of a fan. The size in layout as opposed to single chip component structure is vastly reduced. The assembly is low cost and simple to manufacture. The system provides very good electrical characteristics, capable of handling 100 MHz clocks and higher. Further, the system is easily installable into a completely assembled laptop/notebook case, so that it can installed by unskilled labor, or consumers using simple tools.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An electronic assembly, comprising:
   a board having a surface including an array of board contacts;
   a circuit module having a first surface and a second surface opposite the first surface, including a substrate, a multilayer interconnect on the substrate, a plurality of integrated circuits on the substrate in electrical communication with the multilayer interconnect, and an array of circuit contacts on the first surface in electrical communication with the multilayer interconnect;
   a connector including conductors for connection between circuit contacts in the array of circuit contacts on the circuit module and board contacts in the array of board contacts on the board;
   a heat spreader assembly in thermal contact with the second surface of the circuit module; and
   a fastener which fastens the circuit module to the board and to the heat spreader assembly such that thermal contact is made between the circuit module and the heat spreader, and electrical contact is made through the connector between the array of circuit contacts and the array of board contacts.

2. The assembly of claim 1, wherein the fastener comprises a clamp plate coupled with the board, and means for clamping the board, circuit module, and heat spreader assembly to the clamp plate.

3. The assembly of claim 2, wherein the means for clamping comprises a releasable mechanism, such that the circuit module may be removed.

4. The assembly of claim 3, wherein the releasable mechanism comprises a screw.

5. The electronic assembly of claim 1, wherein the connector comprises a compliant plate having an array of conductors disposed through the plate, arranged such that when pressure is applied to the array of conductors, electrical connection is made.

6. An electronic assembly, comprising:
   a board having a surface including an array of board contacts;
   a circuit module having a first surface and a second surface opposite the first surface, including an array Of circuit contacts on the first surface;
   a connector including conductors between circuit contacts in the array of circuit contacts on the circuit module and board contacts in the array of board contacts on the board;
   a heat spreader assembly in thermal contact with the second surface of the circuit module; and
   a fastener which fastens the circuit module to the board and to the heat spreader assembly such that thermal contact is made between the circuit module and the heat spreader, and electrical contact is made through the connector between the array of circuit contacts and the array of board contacts, wherein the heat spreader assembly includes:
   a plate having an opening larger than the circuit module; and
   a thermal bridge member larger than the opening in the plate, and in thermal contact with the second surface of the circuit module and with the plate, arranged so that the circuit module is within the opening.

7. The assembly of claim 6, wherein the circuit module comprises a thermally conductive substrate; and the thermal bridge member is bonded to the thermally conductive substrate of the circuit module.

8. The assembly of claim 6, wherein the thermal bridge member is bonded to the circuit module.

9. The electronic assembly of claim 6, wherein the connector comprises a compliant plate having an array of conductors disposed through the plate, arranged such that when pressure is applied to the array of conductors, electrical connection is made.

10. An electronic assembly, comprising:
    a board having a surface including an array of board contacts;
    a circuit module having a first surface and a second surface opposite the first surface, including an array of circuit contacts on the first surface;
    a connector including conductors between circuit contacts in the array of circuit contacts on the circuit module and board contacts in the array of board contacts on the board;
    a heat spreader assembly in thermal contact with the second surface of the circuit module; and
    a fastener which fastens the circuit module to the board and to the heat spreader assembly such that thermal contact is made between the circuit module and the heat spreader, and electrical contact is made through the connector between the array of circuit contacts and the array of board contacts, wherein the fastener comprises:

a clamp plate coupled with the board;

the heat spreader assembly includes a plate having an opening with an inside dimension larger than an outside dimension of the circuit module, and a thermal bridge member having an outside dimension larger than the inside dimension of the opening; and means for clamping the thermal bridge member to the clamp plate with sufficient force to hold the thermal bridge member in thermal contact with the heat spreader and the circuit module in electrical contact with the board through the connector, arranged so that the circuit module is within the opening.

11. The assembly of claim 10, wherein the means for clamping comprises a releasable mechanism, such that the circuit module may be removed.

12. The assembly of claim 11, wherein the releasable mechanism comprises a screw.

13. The electronic assembly of claim 10, wherein the connector comprises a compliant plate having an array of conductors disposed through the plate, arranged such that when pressure is applied to the array of conductors, electrical connection is made.

14. An electronic assembly, comprising:

a board having a surface including an array of board contacts;

circuit module having a first surface and a second surface opposite the first surface, including an array of circuit contacts on the first surface;

a connector including conductors between circuit contacts in the array of circuit contacts on the circuit module and board contacts in the array of board contacts on the board;

a heat spreader assembly in thermal contact with the second surface of the circuit module;

a fastener which fastens the circuit module to the board and to the heat spreader assembly such that thermal contact is made between the circuit module and the heat spreader, and electrical contact is made through the connector between the array of circuit contact and the array of board contacts; and a second circuit module comprising a substrate, at least one integrated circuit chip and an interconnect structure mounted on the substrate, and a second connector including conductors for connecting the interconnect structure on the substrate of the second circuit module with contacts in one or both of the array of board contacts and the array of circuit contacts, and arranged so that the second circuit module is stacked between the board and the heat spreader assembly.

15. The electronic assembly of claim 14, wherein the connector comprises a compliant plate having an array of conductors disposed through the plate, arranged such that when pressure is applied to the array of conductors, electrical connection is made.

16. A computer, comprising:

a case having an openable cover;

a circuit board mounted within the case, having a mounting surface facing the openable cover of the case;

a circuit module including a substrate, a multilayer interconnect on the substrate, and a plurality of integrated circuits on the substrate in electrical communication with the multilayer interconnect;

a connector including conductors between the multilayer interconnect on the circuit module and the circuit board;

a heat spreader mounted within the case; and a fastener assembly, which when engaged fastens the mounting surface of the circuit board, circuit module and heat spreader together such that thermal contact is made between the circuit module and the heat spreader, and electrical contact is made through the connector between the circuit module and the circuit board, and which when disengaged permits removal of the circuit module through the openable cover of the case.

17. The computer of claim 16, wherein the circuit board includes an array of board contacts on the mounting surface, and the circuit module includes a first surface and a second surface opposite the first surface, the first surface including an array of circuit contacts on the first surface in electrical communication With the multilayer interconnect; and the connector includes:

a compliant interposer between the circuit board and the first surface of the circuit module, including said conductors through the Compliant interposer between circuit contacts in the array of circuit contacts on the circuit module and board contacts in the array of board contacts on the circuit board; and the fastener assembly includes a thermal bridge member in thermal contact with the second surface of the circuit module and the heat spreader; and a mechanical fastener which when engaged fastens the circuit board, interposer, circuit module, thermal bridge member and heat spreader together such that thermal contact is made between the circuit module and the thermal bridge member and between the thermal bridge member and the heat spreader, and electrical contact is made between the array of circuit contacts and the conductors in the compliant interposer and between the conductors in the compliant interposer and the array of board contacts.

18. The computer of claim 17, wherein the mechanical fastener comprises a clamp plate coupled with the circuit board, and means for clamping the circuit board, interposer, circuit module, thermal bridge member and heat spreader to the clamp plate.

19. The computer of claim 18, wherein the means for clamping comprises a screw.

20. The computer of claim 17, wherein the mechanical fastener comprises:

a clamp plate coupled with the board;

the heat spreader including an opening with an inside dimension larger than an outside dimension of the circuit module, but over-lapping the thermal bridge member; and means for clamping the thermal bridge member to the clamp plate with sufficient force to hold the thermal bridge member in thermal contact with the heat spreader and the circuit module in electrical contact with the board through the interposer.

21. The computer of claim 20, wherein the means for clamping comprises a screw.

22. The computer of claim 16, wherein the connector comprises a compliant plate having an array of conductors disposed through the plate, arranged such that when pressure is applied to the array of conductors, electrical connection is made.

23. A computer, comprising:

a case having an openable cover;

a circuit board mounted within the case, having a mounting surface facing the openable cover of the case;

a circuit module;

a connector including conductors between the circuit module and the circuit board;

a heat spreader mounted within the case; and a fastener assembly, which when engaged fastens the mounting surface of the circuit board, circuit module and heat spreader together such that thermal contact is made between the circuit module and the heat spreader, and electrical contact is made through the connector between the circuit module and the circuit board, and which when disengaged permits removal of the circuit module through the openable cover of the case, wherein the circuit module comprises a thermally conductive substrate, and at least one integrated circuit chip and an interconnect structure mounted on the substrate.

24. The computer of claim 23, wherein the the at least one integrated circuit chip includes a central processing unit for the computer.

25. The computer of claim 23, wherein the connector comprises a compliant plate having an array of conductors disposed through the plate, arranged such that when pressure is applied to the array of conductors, electrical connection is made.

26. A computer, comprising:

a case having an openable cover;

a circuit board mounted within the case, having a mounting surface facing the openable cover of the case;

a circuit module;

a connector including conductors between the circuit module and the circuit board;

a heat spreader mounted within the case; and a fastener assembly, which when engaged fastens the mounting surface of the circuit board, circuit module and heat spreader together such that thermal contact is made between the circuit module and the heat spreader, and electrical contact is made through the connector between the circuit module and the circuit board, and which when disengaged permits removal of the circuit module through the openable cover of the case, including a second circuit module stacked with said circuit module, and wherein the fastening assembly when engaged establishes electrical contact between the second circuit module and the circuit board.

27. The computer of claim 26, wherein the connector comprises a compliant plate having an array of conductors disposed through the plate, arranged such that when pressure is applied to the array of conductors, electrical connection is made.

28. A computer, comprising:

a case having an openable cover;

a circuit board mounted within the case, having a mounting surface facing the openable cover of the case;

a circuit module;

a connector including conductors between the circuit module and the circuit board;

a heat spreader mounted within the case; and a fastener assembly, which when engaged fastens the mounting surface of the circuit board, circuit module and heat spreader together such that thermal contact is made between the circuit module and the heat spreader, and electrical contact is made through the connector between the circuit module and the circuit board, and which when disengaged permits removal of the circuit module through the openable cover of the case, wherein the circuit module includes an interconnect structure having power and ground supply buses, and including supply filter components mounted on the circuit board, and coupled to the supply buses on the circuit module through the connector.

29. The computer of claim 28, wherein the connector comprises a compliant plate having an array of conductors disposed through the plate, arranged such that when pressure is applied to the array of conductors, electrical connection is made.

30. A method for assembling a computer having a case with an openable cover, a circuit board within the case and a heat spreader, comprising:

providing an array of board contacts on the circuit board inside the case accessible through the openable cover;

providing a circuit module including one or more integrated circuits and an interconnect structure, the interconnect structure including an array of circuit contacts;

providing a thermal bridge member contacting the heat spreader and a surface of the circuit module opposite the array of circuit contacts; and mechanically fastening the circuit module to the circuit board through the openable cover of the case such that thermal contact is made between the circuit module and the heat spreader, and electrical contact is made between the circuit module and the circuit board;

wherein the heat spreader is between the circuit board and the openable cover, and includes an opening with an inside dimension larger than the outside dimension of the circuit module, but smaller the outside dimension of the thermal bridge member, and the step of fastening includes providing a clamp seat coupled with the circuit board, and clamping the thermal bridge member to the clamp seat such that the thermal bridge member contacts the circuit module and the heat spreader, and the circuit module is electrically and mechanically engaged to the circuit board between the thermal bridge member and the circuit board.

31. The method of claim 30, wherein the step of mechanically fastening includes:

providing an interposer between the circuit board and the array of circuit contacts on the circuit module, including conductors between circuit contacts in the array of circuit contacts on the circuit module and board contacts in the array of board contacts on the circuit board; and fastening the circuit board, interposer, circuit module, thermal bridge member and heat spreader together such that thermal contact is made between the circuit module and the thermal bridge member and between the thermal bridge member and the heat spreader, and electrical contact is made between the array of circuit contacts and the conductors in the interposer and between the conductors in the interposer and the array of board contacts.

* * * * *